United States Patent [19]
Williams

[11] Patent Number: 5,998,836
[45] Date of Patent: Dec. 7, 1999

[54] TRENCH-GATED POWER MOSFET WITH PROTECTIVE DIODE

[75] Inventor: Richard K. Williams, Cupertino, Calif.

[73] Assignee: Siliconix Incorporated, Santa Clara, Calif.

[21] Appl. No.: 08/846,688

[22] Filed: Apr. 30, 1997

Related U.S. Application Data

[63] Continuation of application No. 08/459,555, Jun. 2, 1995, abandoned.

[51] Int. Cl.$^6$ ............................. H01L 29/78; H01L 29/49
[52] U.S. Cl. ......................... 257/341; 257/328; 257/331; 257/409
[58] Field of Search .................................. 257/328, 331, 257/341, 409

[56] References Cited

U.S. PATENT DOCUMENTS

| | | | |
|---|---|---|---|
| 3,906,540 | 9/1975 | Hollins | 357/15 |
| 4,823,172 | 4/1989 | Mihara | 357/15 |
| 4,827,321 | 5/1989 | Baliga | 357/37 |
| 4,928,155 | 5/1990 | Nakagawa | 257/341 |
| 4,967,243 | 10/1990 | Baliga et al. | 357/23.4 |
| 5,021,840 | 6/1991 | Morris | 357/15 |
| 5,072,266 | 12/1991 | Bulucea et al. | 357/23.4 |
| 5,111,253 | 5/1992 | Korman et al. | 357/15 |
| 5,168,331 | 12/1992 | Yilmaz | 257/331 |
| 5,191,395 | 3/1993 | Nishimura | 257/341 |
| 5,621,234 | 4/1997 | Kato | 257/328 |
| 5,689,128 | 11/1997 | Hsieh et al. | 257/331 |
| 5,696,396 | 12/1997 | Tokura et al. | 257/341 |
| 5,814,858 | 9/1998 | Williams | 257/328 |

FOREIGN PATENT DOCUMENTS

| | | |
|---|---|---|
| 0 133 642 | 3/1985 | European Pat. Off. . |
| 0438700 | 7/1991 | European Pat. Off. ............... 257/328 |
| 0 583 022 | 2/1994 | European Pat. Off. . |
| 0 583 028 | 2/1994 | European Pat. Off. . |
| 4208695 | 9/1992 | Germany ................................ 257/328 |
| 62-298152 | 12/1987 | Japan ...................................... 257/328 |
| 2 269 050 | 1/1994 | United Kingdom . |

OTHER PUBLICATIONS

Hoshi et al., "A DMOSFET Having A Cell Array Field Ring For Improved Avalanche Capability", 1993 IEEE, Proceedings of The 5th International Symposium on Power Semiconductor Devices and ICs., May 18–20, 1993, pp. 140–145.

Masakatsu, Hoshi et al.: "A DMOSFET Having a Cell Array Field Ring for Improving Avalanche Capability", May 18, 1993, Proceedings of the International Symposium on Power Semiconductor Devices and IC's (ISPSD), Monterey, May 18–20, 1993, pp. 141–145, XP000380145.

*Primary Examiner*—Jerome Jackson, Jr.
*Attorney, Agent, or Firm*—Skjerven, Morrill MacPherson, Franklin & Friel LLP; David E. Steuber

[57] ABSTRACT

A power MOSFET includes a trenched gate which defines a plurality of MOSFET cells. A protective diffusion is created, preferably in an inactive cell, so as to form a diode that is connected in parallel with the channel region in each of the MOSFET cells. The protective diffusion, which replaces the deep central diffusion taught in U.S. Pat. No. 5,072,266, prevents impact ionization and the resulting generation of carriers near the corners of the gate trench, which can damage or rupture the gate oxide layer. Moreover, the diode can be designed to have a breakdown voltage which limits the strength of the electric field across the gate oxide layer. The elimination of a deep central diffusion permits an increase in cell density and improves the on-resistance of the MOSFET.

27 Claims, 10 Drawing Sheets

TRENCH-GATED POWER MOSFET WITH PROTECTIVE DIODE

CROSS REFERENCE TO RELATED APPLICATION

This application is a continuation of application Ser. No. 08/459,555, filed Jun. 2, 1995 now abandoned.

This application is related to application Ser. No. 08/460,336, filed concurrently herewith, which is incorporated herein by reference in its entirety.

FIELD OF THE INVENTION

This invention relates to power field-effect transistors and, in particular, to a metal-oxide-silicon field-effect transistor (MOSFET) in which the gate is positioned in a trench formed on the surface of the silicon.

BACKGROUND OF THE INVENTION

Trench-gated MOSFETs are a class of MOSFETs in which the gate is positioned in a trench that is formed at the surface and extends into the silicon. The gate is formed in lattice-like geometric pattern which defines individual cells of the MOSFET, the pattern normally taking the form of closed polygons (squares, hexagons, etc.) or a series of interdigitated stripes or rectangles. The current flows in vertical channels which are formed adjacent to the sides of the trenches. The trenches are filled with a conductive gate material, typically doped polysilicon, which is insulated from the silicon by a dielectric layer normally consisting of silicon dioxide.

Two critical characteristics of a power MOSFET are its breakdown voltage, i.e., the voltage at which it begins to conduct current when in an off condition, and its on-resistance, i.e., its resistance to current flow when in an on condition. The on-resistance of a MOSFET generally varies directly with its cell density, since when there are more cells per unit area there is also a greater total "gate width" (around the perimeter of each cell) for the current to pass through. The breakdown voltage of a MOSFET depends primarily on the doping concentrations and locations of the source, body and drain regions in each MOSFET cell.

The MOSFET is typically formed in a lightly-doped epitaxial layer of silicon which is grown on a heavily-doped silicon substrate. The gate trenches normally extend into the epitaxial layer and are frequently rectangular, with flat bottoms bounded by corners. This configuration creates a problem in that, when the MOSFET is turned off, the electric field reaches a maximum near the corners of the gate trenches. This can lead to avalanche breakdown and impact ionization near the surface of the gate oxide, with the consequent generation of carriers. If the carriers are generated within a mean free path of the interface between the silicon and the gate oxide, they may have sufficient energy to pass through the interface and become injected into the gate oxide layer. Carriers that are able to surmount the silicon/silicon dioxide energy barrier are often referred to as "hot carriers." Hot carrier injection can ultimately damage the gate oxide layer, causing changes in threshold voltage, transconductance or on-resistance, and thereby impair or destroy the MOSFET.

Figure 1:
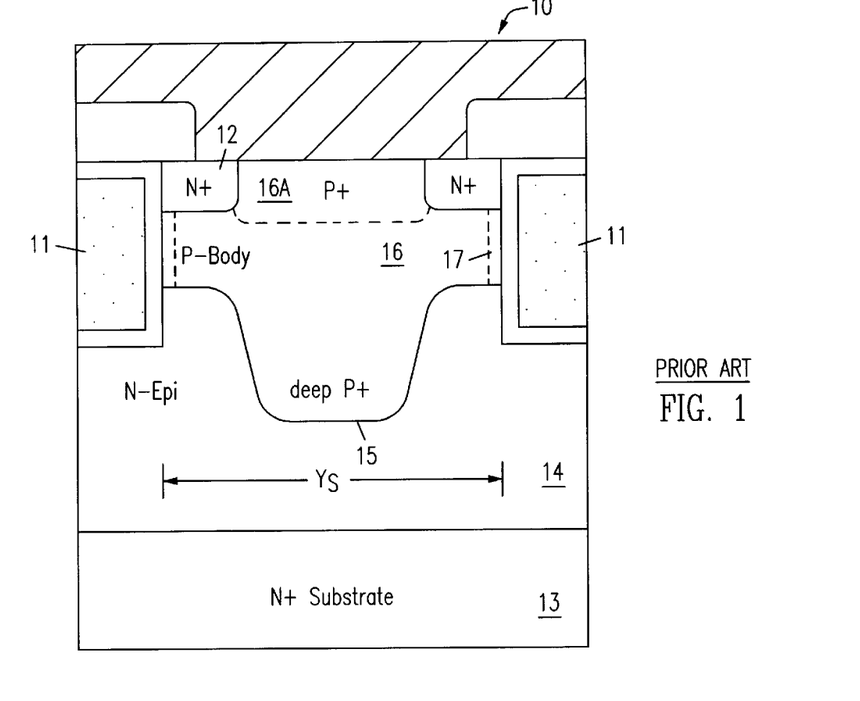
FIG. 1 illustrates a cross-sectional view of a conventional trench-gated MOSFET containing a deep central diffusion to reduce the electric field at the corners of the trenches.

U.S. Pat. No. 5,072,266 teaches a technique of suppressing voltage breakdown near the gate by the formation, in the MOSFET cell, of a deep central body diffusion that extends below the bottom of the trenches. This deep central diffusion shapes the electric field in such a way that breakdown occurs in the bulk silicon away from the gate, in a location which prevents hot carriers from reaching the gate oxide layer. A cross-sectional view of a MOSFET in accordance with U.S. Pat. No. 5,072,266 is shown in FIG. 1, which illustrates a MOSFET cell 10 containing a trenched gate 11, an N+ source region 12, an N+ substrate (drain) 13, an N-epitaxial layer 14, and a deep central P+ diffusion 15. Note that the lowest point of P+ diffusion 15 is below the bottom of gate 11.

The doping of deep P+ diffusion 15 is greater than the doping of P-body 16 in the region of the channel, designated by the dashed line and reference numeral 17. As a result, the distance $Y_S$ between the gate trenches must be maintained at or above a minimum value. Otherwise, the deep P+ dopant will diffuse into the channel 17 and raise the threshold voltage $V_{th}$ of the device. The value of $Y_S$, along with the thickness of the gate, defines the cell density and helps to determine the on-resistance of the MOSFET.

To fabricate an extremely low voltage, low on-resistance power MOSFET, the dimensions of the device are generally scaled down. In particular, the cell density is increased and the epitaxial layer is made thinner, even to the point that the gate trenches may extend into the heavily-doped substrate. Such a MOSFET is illustrated as MOSFET 20 in FIG. 2A.

Figure 2A:
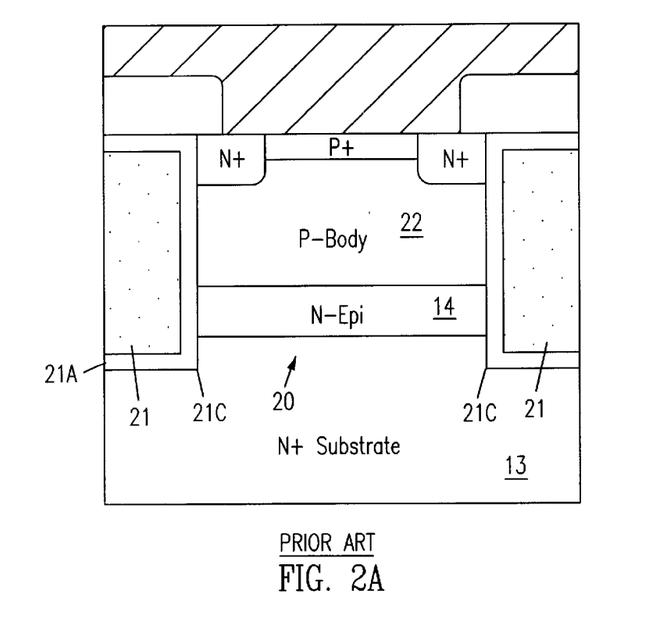
FIG. 2A illustrates a cross-sectional view of a conventional trench-gated MOSFET without a deep central diffusion and wherein the trenches extend into the substrate.

This creates an entirely new set of design criteria. Referring to FIG. 2A, since the corners 21C of the gate trenches 21 are surrounded by the N+ substrate 13, the electric field at these locations drops entirely across the gate oxide layer. While the formation of hot carriers in the silicon may be lower, the high electric field on the gate oxide layer may still lead to device degradation or damage. In one condition, when the gate is biased at essentially the same potential as the source and body (i.e., the device is turned off), a serious concern is that the gate oxide layer at the bottom of the trenches must support the entire voltage across the device. Compared to the embodiment of FIG. 1, there is no epitaxial layer to absorb a portion of this voltage difference.

Figure 2B:
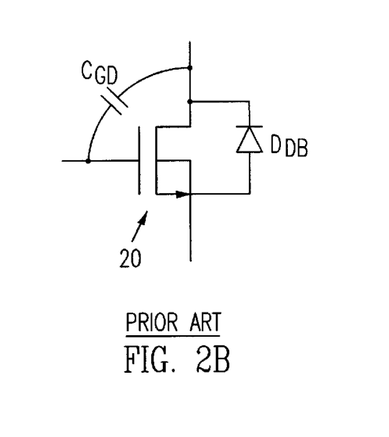
FIG. 2B illustrates an equivalent circuit diagram for the MOSFET of FIG. 2A.

An equivalent circuit for MOSFET 20 is shown in FIG. 2B. Diode $D_{DB}$ represents the PN junction between N-epitaxial layer 14 and P-body region 22, and capacitor $C_{GD}$ represents the capacitor across the gate oxide layer 21A

SUMMARY OF THE INVENTION

The trench-gated MOSFET of this invention is formed in a semiconductor chip which includes a substrate alone or in combination with an overlying epitaxial layer. The gate of the MOSFET is formed in a trench which extends downward from the surface of the chip. The MOSFET includes a source region of a first conductivity type, a body region of a second conductivity type, and a drain region of the first conductivity type, which are arranged vertically along a side wall of the trench. The gate trenches may extend into the epitaxial layer, or through the epitaxial layer into the substrate.

The MOSFET is formed as a plurality of cells which are defined by the gate trench. The cells may be of any shape. For example, the cells may be in the form of a square or hexagon or a series of parallel stripes or rectangles.

In accordance with this invention, there is created in the chip a protective diffusion of the second conductivity type, which forms a PN junction with first conductivity material in the epitaxial layer or substrate. This PN junction functions as a diode. A metal layer ties the protective diffusion (i.e., one terminal of the diode) to the source regions of the MOSFET cells such that the diode is connected in parallel with the channels of the MOSFET cells.

In a preferred embodiment, the protective diffusion is formed in certain of the cells in a selected pattern across the MOSFET.

The protective diffusion of second conductivity type operates to reduce the strength of the electric field across the gate oxide and at the corners of the trenches and limits the formation of hot carriers in the vicinity of the trench, particularly in embodiments wherein the trenches extend into the epitaxial layer. The diode operates as a voltage clamp and thereby limits the voltage across the gate oxide layer, particularly in embodiments wherein the trenches extend into the substrate and the gate oxide must support the entire voltage drop across the MOSFET.

In a preferred embodiment, one cell containing a protective diffusion ("diode cell") is provided for a selected number of active MOSFET cells ("active cells"), in a repetitive pattern across the MOSFET. The number of diode cells per active cells is determined by the design criteria of the MOSFET. In general, for example, MOSFETs which are expected to experience breakdown more often will require a greater proportion of diode cells.

The presence of the diode cell also tends to carry a large portion of the drain-to-body diode current when the MOSFET is operated with its body diode forward-conducting. Such operation (called Quadrant III operation for an N-channel device) commonly occurs when an inductor or motor is driven by a push-pull or bridge-configured pair of MOSFETs. High diode currents in the active cells are undesirable since they may lead to minority charge storage, which complicates diode turn-off (forced diode reverse recovery) and may lead to snapback of the parasitic source-body-drain active cell NPN bipolar transistor when a high reverse voltage is once again applied across the device.

DESCRIPTION OF THE INVENTION

Figure 3:
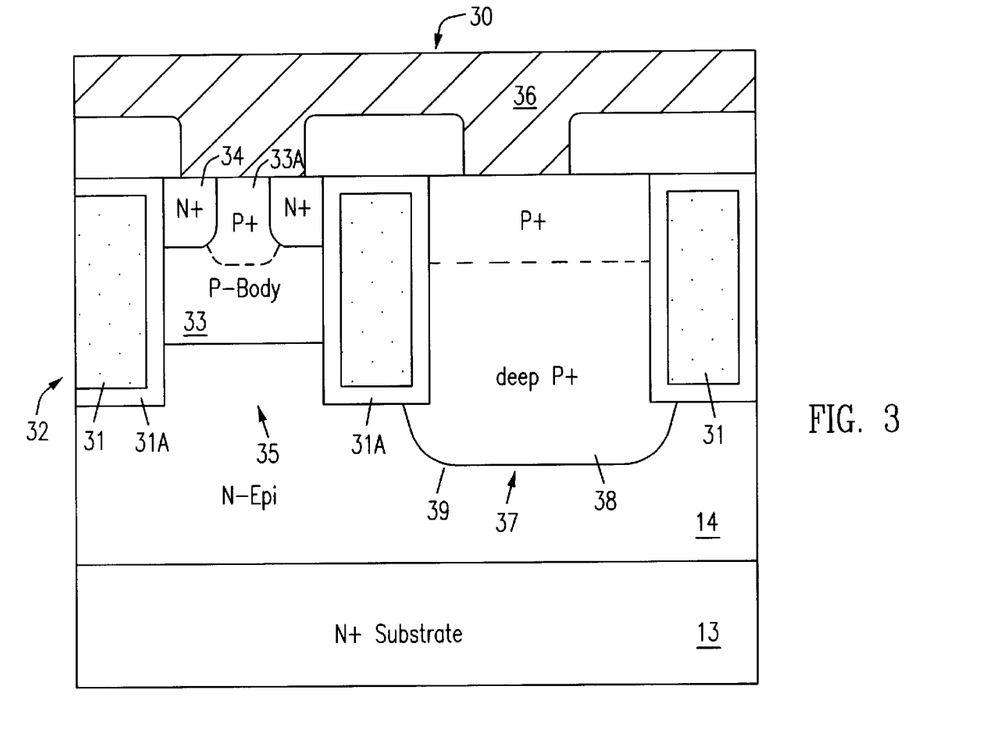
FIG. 3 illustrates a cross-sectional view of a first embodiment of this invention including a protective diffusion in an adjacent MOSFET cell.

A first embodiment of the invention is illustrated in FIG. 3. A trench-gated MOSFET 30 is formed in N-epitaxial layer 14, which is grown on the top surface of N+ substrate 13. A gate 31, formed in a trench 32, is separated from the semiconductor material by an oxide layer 31A. A cell 35 of MOSFET 30 also includes a P-body region 33, a shallow P+ contact region 33A, and an N+ source region 34. A metal layer 36 makes contact with and forms a short between P-body region 33 and N+ source region 34.

N+ substrate 13 serves as the drain of MOSFET 30 and may be contacted from the bottom. Alternatively, a submerged N+ layer instead of the N+ substrate could be used as the drain, and the drain could be contacted from the top side of the structure by means of, for example, an N+ sinker region and a top side contact.

In a neighboring cell 37 a protective deep P+ diffusion 38 is formed. Diffusion 38 forms a PN junction 39 with N-epitaxial layer 14. Metal layer 36 contacts protective diffusion 38, and thus PN junction 39 represents a diode which is connected in parallel with the channel of cell 35.

Protective diffusion 38 limits the strength of the electric field and resulting carrier formation near the corners of trench 32 and thereby eliminates the need for a deep central diffusion in MOSFET cell 35. With no deep central P+ diffusion, the dimensions of MOSFET cell 35 may be substantially reduced and the cell density of MOSFET 30 may be significantly increased. For example, the width of each side of N+ source region 34 may be reduced to about 1.0 $\mu$m, and the width of the contact between metal layer 36 and the P+ contact region for P-body 33 may be reduced to about 1.0 $\mu$m, so that the total width between trenches 31 may be on the order of 3.5 $\mu$m, although in practice the total width between trenches 31 might be set at 5.0 $\mu$m. This compares with a minimum width of about 8.0 $\mu$m for a MOSFET cell which contains a deep central diffusion (see FIG. 1).

Figure 4A:
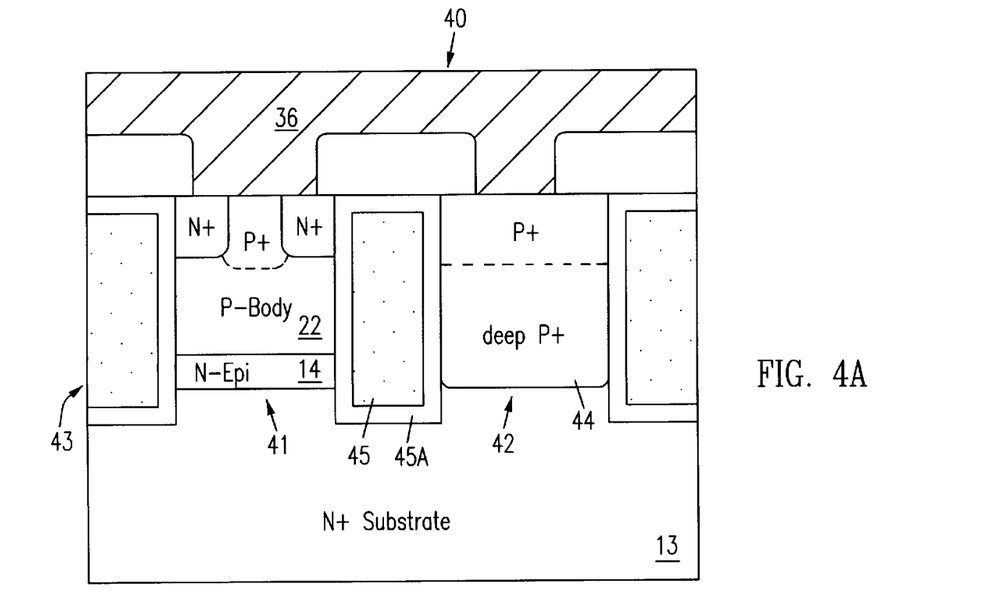
FIG. 4A illustrates a cross-sectional view of a second embodiment of this invention including a protective diffusion in an adjacent MOSFET cell and wherein the trenches extend into the substrate.

FIG. 4A illustrates a MOSFET 40 which includes a MOSFET cell 41 similar to the cell shown in FIG. 2A. That is, trenches 43 extend through the N-epitaxial layer 14 and into the N+ substrate 13, and cell 41 does not include a central deep P+ diffusion. In an adjacent cell 42, a protective P+ diffusion 44 is formed, with the lower junction of diffusion 44 reaching the top surface of N+ substrate 13.

Figure 4B:
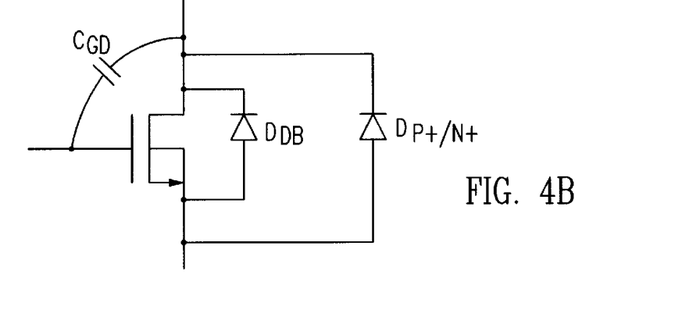
FIG. 4B illustrates an equivalent circuit diagram for the MOSFET of FIG. 4A.

FIG. 4B illustrates an equivalent circuit for MOSFET 40. Since the corners of trench 43 are located in the N+ substrate 13, which being heavily-doped cannot support a strong electric field, the problem of the electric field at the corners of the trenches is largely eliminated. Instead, the critical factor becomes the strength of the electric field between the gate 45 and the N+ substrate 13, i.e., across the gate oxide layer 45A. This location is represented by a capacitor $C_{GD}$ in FIG. 4B. The PN junction between P-body region 22 and N-epitaxial layer 14 is represented by a diode $D_{DB}$, and the PN junction between P+ diffusion 44 and N+ substrate 13 is represented by a diode $D_{P+/N+}$. As shown, both diode $D_{DB}$ and diode $D_{P+/N+}$ are connected in parallel with the channel of MOSFET cell 41.

Figure 5:
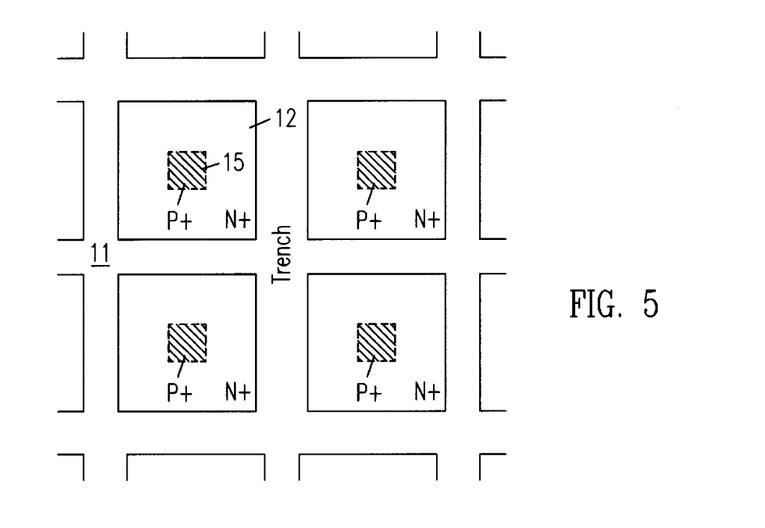
FIG. 5 illustrates a top view of a conventional MOSFET cell.

FIG. 5 shows a top view of the conventional MOSFET 10 shown in FIG. 1. The protective deep P+ region 15 is shown at the center of each square cell, surrounded by the N+ source region 12 and the gate 11. Four complete cells are shown in FIG. 5.

Figure 6:
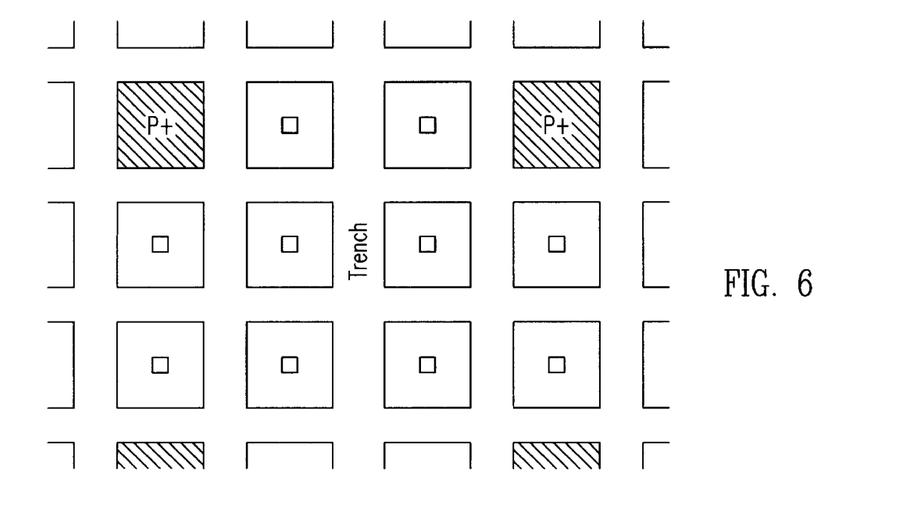
FIG. 6 illustrates a top view of a square-celled MOSFET in accordance with this invention.

FIG. 6 shows a top view of the MOSFET 30 shown in FIG. 3. A top view of MOSFET 40 shown in FIG. 4A would appear similar. Because the protective P+ region at the center of each cell has been eliminated, the dimensions of the cells have been reduced. The cells which contain the P+ diffusions (sometimes referred to as "diode cells") are also shown. In FIG. 6, there is one diode cell for every eight active MOSFET cells (total of nine cells).

Figure 7:
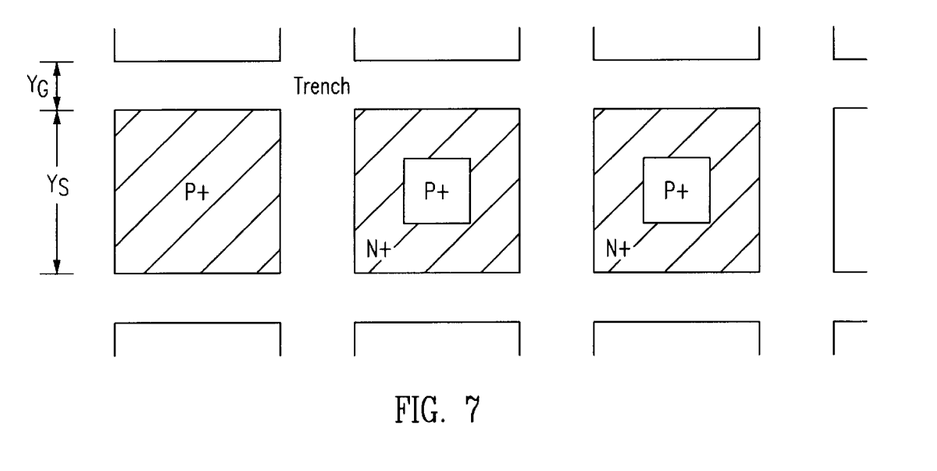
FIG. 7 illustrates a detailed top view of the square-celled MOSFET of FIG. 6.

FIG. 7 shows a detailed top view of three of the cells shown in FIG. 6 (two active MOSFET cells and one diode cell). In FIG. 7, $Y_S$ represents the distance between the trenched gates and $Y_G$ represents the cross-sectional width of the trench (not to be confused with the gate width W). Assuming that there is one diode cell for every n total cells, the following equation gives the total area A of the n cells:

$$A = (Y_G + Y_S)^2 + (n-1)(Y_G + Y_S)^2 = n(Y_G + Y_S)^2$$

Since n−1 of these cells are active MOSFET cells, the total gate width W in the n cells is equal to:

$$W = 4Y_S(n-1)$$

Accordingly, the area-to-width ratio A/W (a figure of merit indicating how effectively a gate width W is packed into an area A) equals:

$$\frac{A}{W} = \frac{(Y_G + Y_S)^2}{4Y_S} \cdot \frac{n}{n-1}$$

Thus the ratio A/W for a MOSFET which contains diode cells is increased by the factor n/(n−1), as compared with a conventional MOSFET with no diode cells. This "penalty" factor, which arises from the fact that the diode cells carry no current, approaches unity as n increases. The penalty is counterbalanced by the increased total gate width (and hence current-carrying capacity) which is obtained by increasing the cell density of the device. Generally, n is determined by the frequency with which the MOSFET is expected to break down. Devices which are expected to break down more frequently will generally require a lower n, i.e., there must be a greater number of diode cells relative to the total number of cells. In the extreme case where every other cell is an inactive (i.e., diode) cell, N=2 and n/n−1=2, the efficiency benefits of this structure are somewhat limited. On the other hand, if only one of every 21 cells is a diode, for example, n=21 and n/n−1=21/20, representing virtually no penalty for the diodes.

In conclusion, the regularly distributed inclusion of non-active deep P+ cells in a vertical trench FET provides a voltage clamping feature which limits the carrier generation rate and electric field at the corners or in the vicinity of the trench gate. The reliability and survivability of the device in the presence of electrical overstressing is thereby improved without limiting on-resistance or cell density. The deep P+ region need not extend to the trench edge but may be made smaller than its cell geometry if desired. The deep P+ region need not extend below the trench if the trench overlaps the N+ substrate, in which case a PIN diode may be formed between the deep P+ region and the N+ substrate (see FIG. 11). A graph showing the breakdown voltage of a PIN diode (such as diode D2 in FIG. 11) as a function of the doping concentration and width of the intermediate or "intrinsic" region is provided in S. M. Sze, *Physics of Semiconductor Devices*, Second Edition, John Wiley & Sons (1981), p. 105, FIG. 32, which is incorporated herein by reference.

Figure 8:
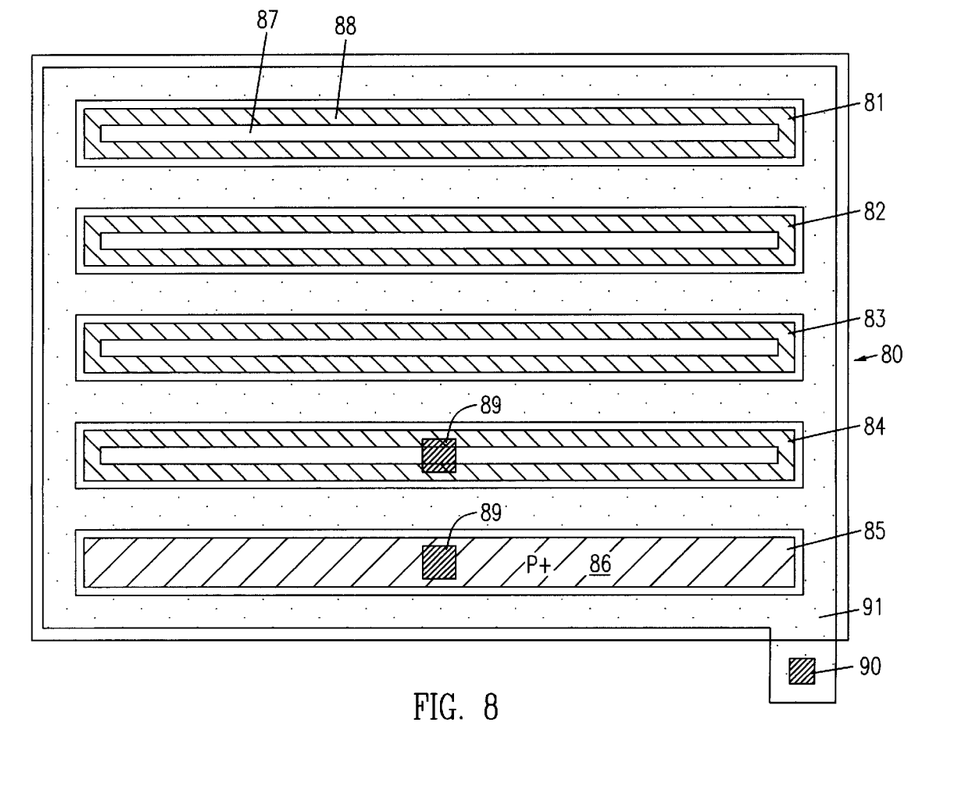
FIG. 8 illustrates a top view of a striped-cell MOSFET in accordance with this invention.

FIG. 8 illustrates a top view of an alternative MOSFET in which the cells are in the form of stripes. In MOSFET 80, cells 81, 82, 83 and 84 are active MOSFET cells, and cell 85 is a diode cell which contains a protective P+ diffusion 86. Each of cells 81–84 contains a P+ contact region 87 and an N+ source region 88. Contact holes 89, two of which are shown in FIG. 8, are used to provide contact between a metal layer (not shown) and P+ region 87 and N+ source region 88 in MOSFET cells 81–84 and P+ region 86 in diode cell 85. Contact holes 89 may be arranged in a variety of patterns over cells 81–85. A contact hole 90 for making contact with gate 91 is also shown.

Figure 9:
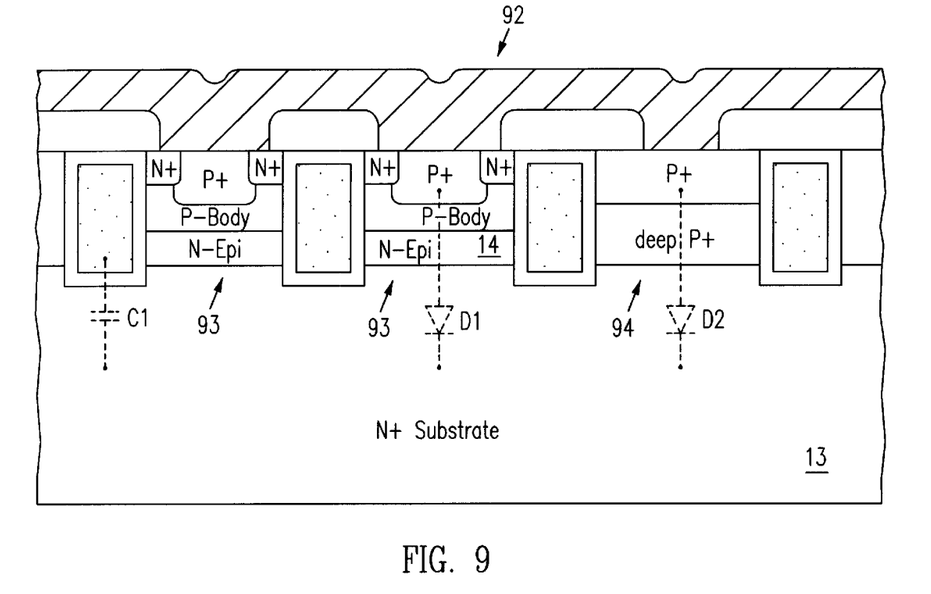
FIG. 9 illustrates another cross-sectional view of the second embodiment in accordance with this invention.
Figure 10:
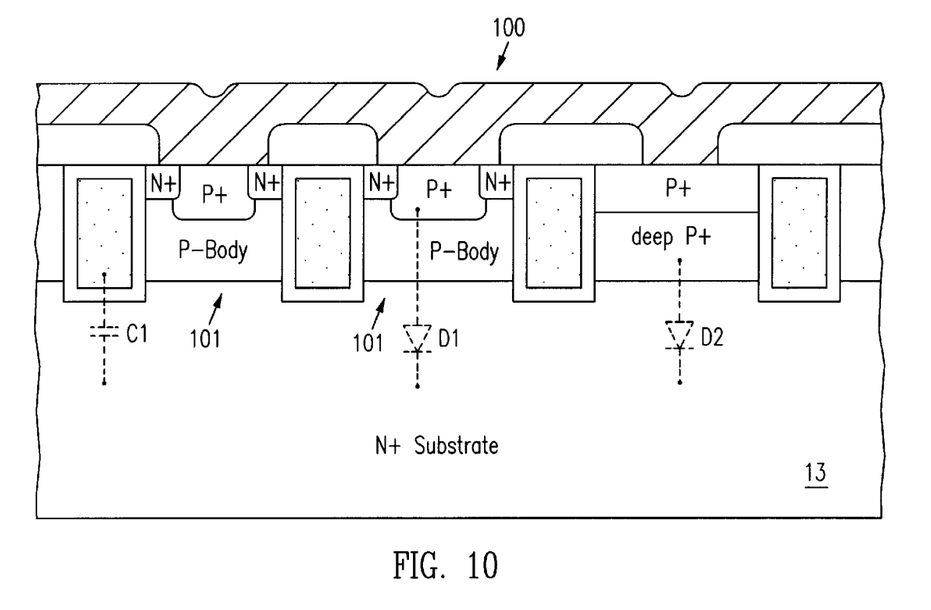
FIG. 10 illustrates a cross-sectional view of a third embodiment in accordance with this invention.
Figure 11:
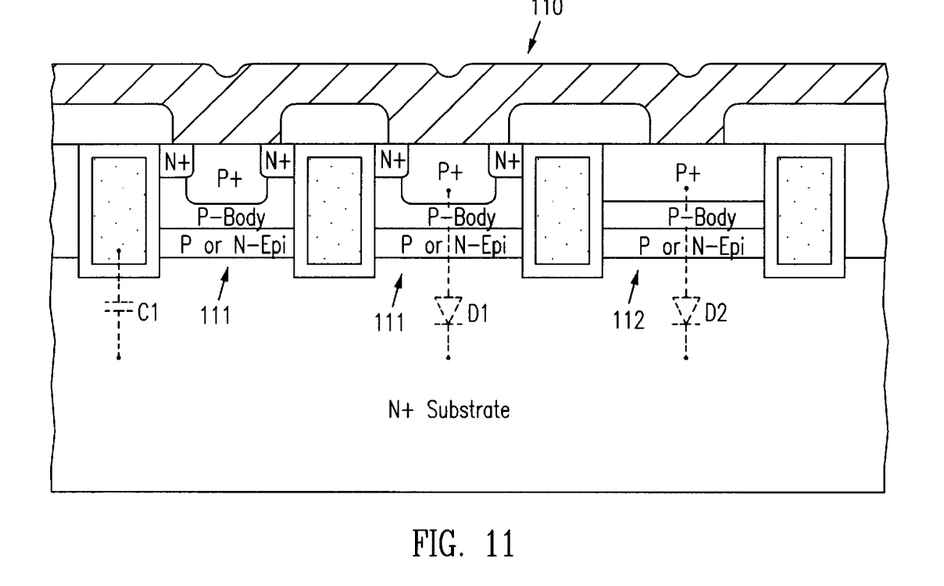
FIG. 11 illustrates a cross-sectional view of a fourth embodiment in accordance with this invention.

Another use of the P+ diode cell is to clamp the drain voltage so as to protect the gate oxide layer from overstress due to excessive electric fields between the gate and the N+ substrate. This situation arises particularly in embodiments where the trench gate extends into the substrate and the gate oxide layer at the bottom of the trench is therefore exposed to the entire voltage difference between the gate and substrate. Silicon dioxide is capable of withstanding a voltage equal to about 8 MV/cm. Using a safety factor of 50%, the industry generally considers the maximum voltage that may be applied across a gate oxide layer to be $X_{OX} \cdot 4$MV/cm, $X_{OX}$ being the thickness of the gate oxide in centimeters. Accordingly, the breakdown voltage of the diode that is formed by the protective P+ diffusion should be no greater than $X_{OX} \cdot 4$MV/cm. For example, with an oxide layer having a thickness of 400 Å, the oxide layer will rupture at about 32V, and for reliable operation the maximum voltage should be limited to 16V FIGS. 9–11 illustrate cross-sectional views of several alternative embodiments in accordance with the invention. FIG. 9 shows a MOSFET 92 in which the trenches extend into the N+ substrate 13. A thin layer of N-epitaxial layer remains in the MOSFET cells 93, while in diode cell 94 the protective P+ diffusion reaches the top surface of N+ substrate 13. In the MOSFET 100 shown in FIG. 10, the P-body regions in the MOSFET cells 101 extend to the top surface of the N+ substrate 13, and none of the N− doped region of epitaxial layer 14 remains. In the MOSFET 110 shown in FIG. 11, a thin section of the epitaxial layer 14, doped P− or N−, remains in each of the MOSFET cells 111 and the diode cell 112.

In FIGS. 9–11, diode D1 represents the PN junction within the MOSFET cells, diode D2 represents the PN junction in the protective diode cells, and a capacitor C1 represents the gate oxide layer abutted by the gate and the N+ substrate. In all three cases the relationship $BV_{D2} < 50\% \; BV_{C1}$ should hold, where $BV_{D2}$ is the breakdown voltage of diode D2 and $BV_{C1}$ is the breakdown voltage of capacitor C1. Also, the breakdown voltage of diode D2 is less than the breakdown voltage of diode D1 in each case.

Figure 12:
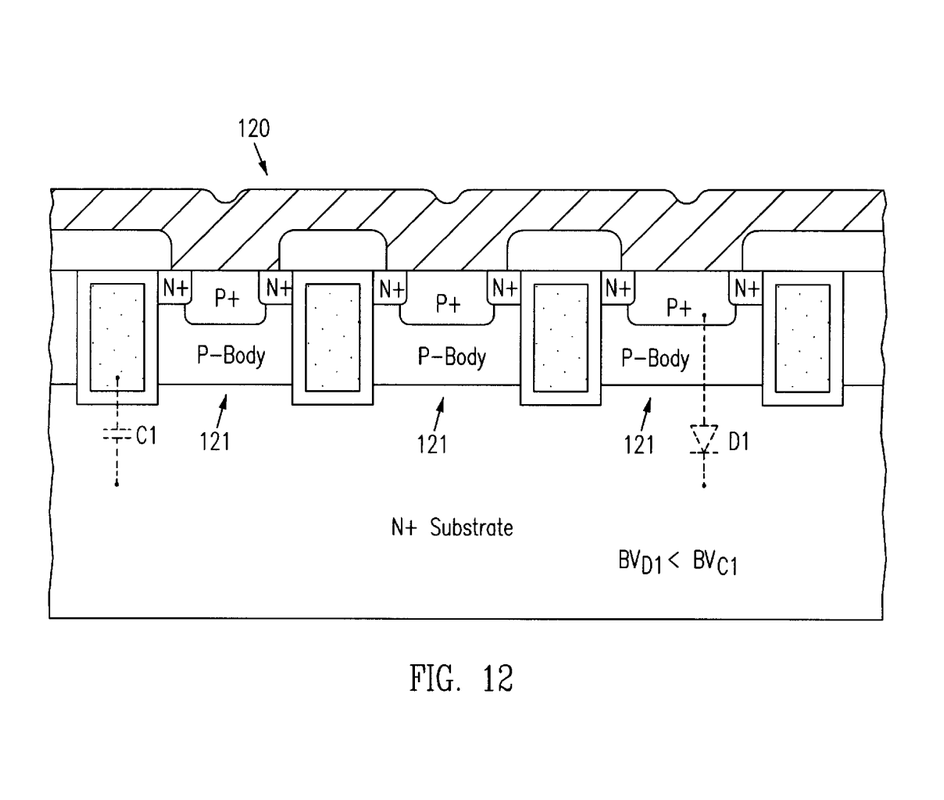
FIG. 12 illustrates a cross-sectional view of a fifth embodiment in accordance with this invention.

MOSFET 120, shown in FIG. 12, appears to be similar to the conventional MOSFET shown in FIG. 2A. Diode D1 represents the PIN diode formed at the center of each MOSFET cell by the combination of the shallow P+ contact region, the P-body and the N+ substrate. In MOSFET 120 the breakdown voltage of PIN diode D1 is set at less than 50% of the breakdown voltage of capacitors C1, wherein the breakdown voltage of the capacitors is calculated on the basis of 8 MV/cm for the thickness of the gate oxide layer expressed in centimeters. As a result, in MOSFET 120 breakdown will occur, if at all, in the central region of the individual cells and at a voltage which will not damage the gate oxide layers.

Figure 13A:
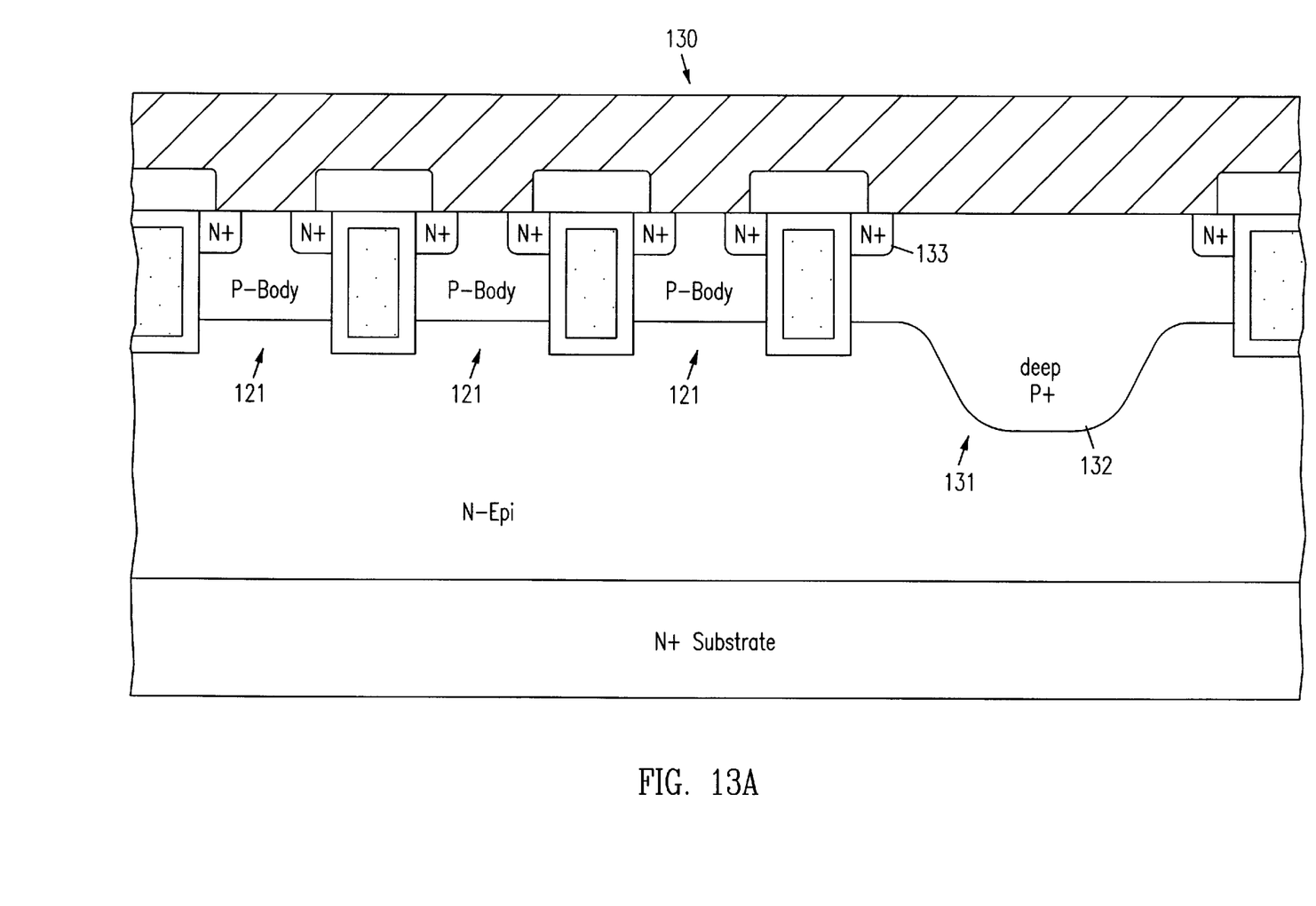
FIGS. 13A and 13B illustrate cross-sectional and top views, respectively, of a sixth embodiment, which includes a wide protective cell.
Figure 13B:
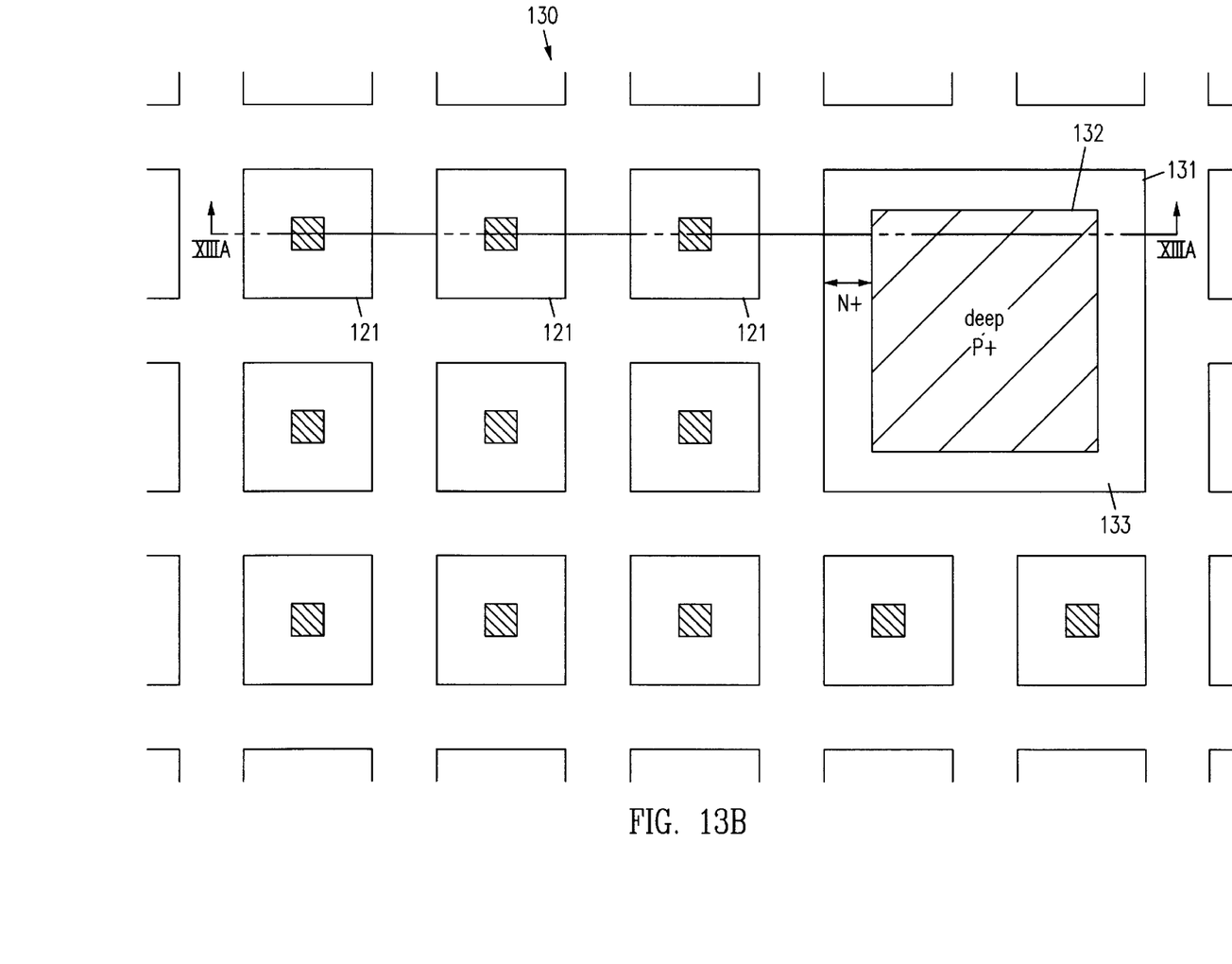

Another alternative embodiment is illustrated in FIGS. 13A and 13B, FIG. 13A being a cross-sectional view taken at section XIIIA—XIIIA shown in the top view of FIG. 13B. MOSFET 130 includes cells 121 as well as a wider cell 131 which includes a deep P+ region 132. Deep P+ region 132 provides a protective function for the gate oxide layers in cells 121 while acting as an active MOSFET cell itself, having an N+ source region 133. Thus, while cell 131 reduces the overall cell density of the MOSFET, the penalty in terms of on-resistance is less than it would be if cell 131 performed only a protective function and carried no current. As in MOSFET 120 of FIG. 12, cells 121 are typically smaller than they would be if a protective deep P+ region were included in each cell.

Although there are numerous processes for fabricating a MOSFET in accordance with this invention, FIGS. 14A–14E illustrate an exemplary process for fabricating MOSFET 30 shown in FIG. 3.

Figure 14A:
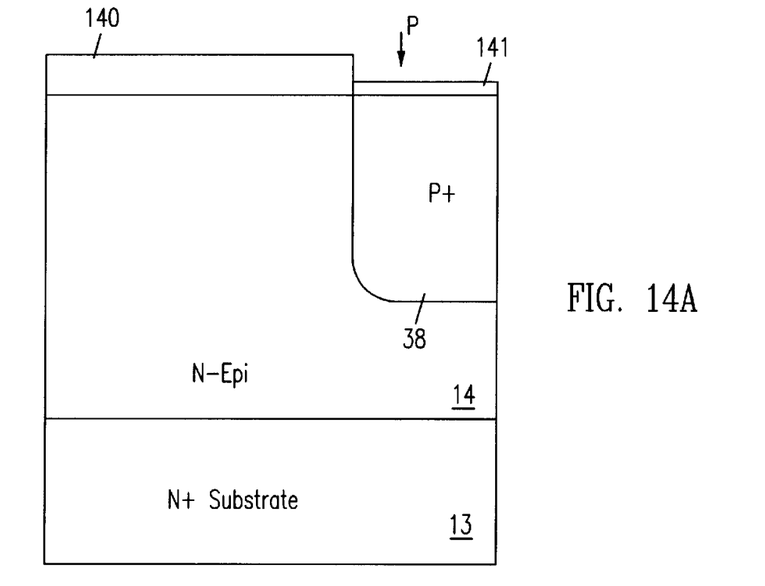
FIGS. 14A–14E illustrate the steps of a process of fabricating the MOSFET shown in FIG. 3.

Referring to FIG. 14A, the starting point is a conventional N+ substrate 13 on which an N-epitaxial layer 14 is grown using known processes.

A thick oxide layer 140 is grown, masked and etched, and a thin oxide layer 141 is grown on the top surface of the structure where deep P+ region 38 is to be formed. Deep P+ region 38 is then implanted through thin oxide layer 141 at a dose of $1 \times 10^{14}$ to $7 \times 10^{15}$ cm$^{-2}$ and an energy of 60–100 keV. The resulting structure is illustrated in FIG. 14A. Oxide layers 140 and 141 are then removed.

Figure 14B:
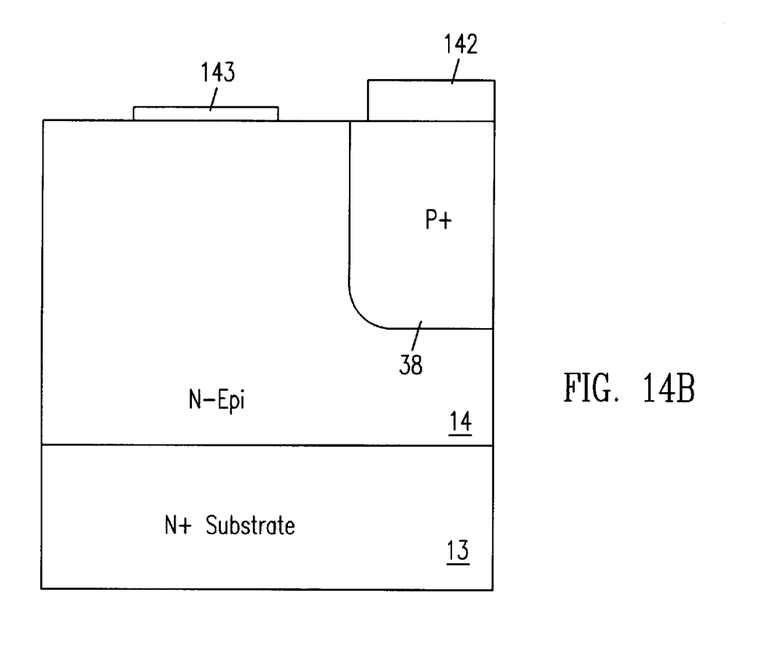

In one version of the process, a thick oxide layer 142 is grown and removed by photomasking except over deep P+ region 38, and a thin oxide layer 143 is grown. Thin oxide layer 143 is masked and removed from the portions of the structure where the trenches are to be formed, as shown in FIG. 14B. The trenches are then masked and etched using known techniques of reactive ion or plasma dry etching. Then the trench is oxidized to form gate oxide layer 31A, and polysilicon is deposited into the trench until it overflows the top of the trench. The polysilicon is then doped with phosphorus by POCl$_3$ predeposition or ion implantation at a dose of $5 \times 10^{13}$ to $5 \times 10^{15}$ cm$^{-2}$ and an energy of 60 keV, giving it a sheet resistance of 20–70 Ω/□. For a P-channel device, the polysilicon is doped with boron using ion implantation to a sheet resistance of roughly 40–120 Ω/□. The polysilicon is then etched back until it is planar with the surface of the trench except where a mask protects it, so that it can subsequently be contacted with metal.

Figure 14C:
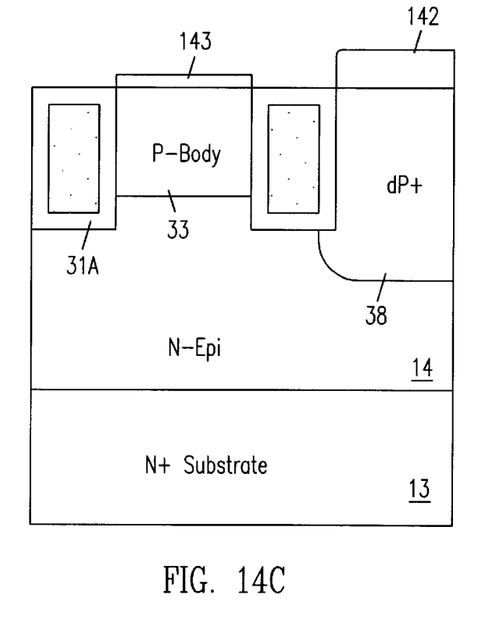

P-body 33 is then implanted through the thin oxide layer 143 (e.g., boron at a dose of $1 \times 10^{13}$ to $4 \times 10^{14}$ cm$^{-2}$ and an energy of 40–100 keV). A similar method is used in fabricating a P-channel device except that the dopant is phosphorus. The resulting structure is illustrated in FIG. 14C.

Figure 14D:
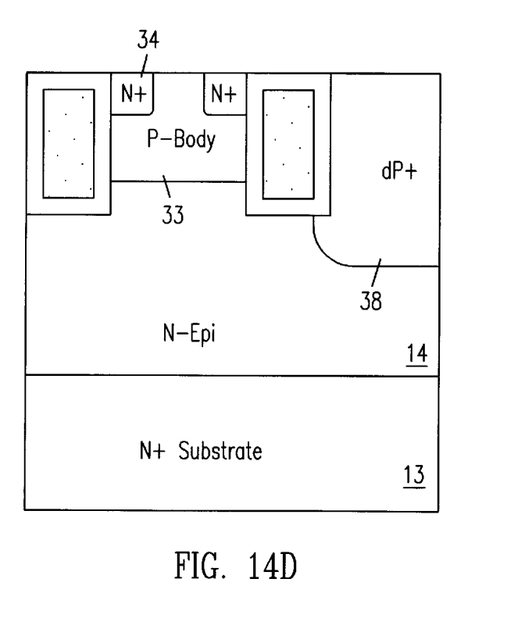

The N+ source region 34 is then introduced using a mask and an arsenic ion implantation (or a boron ion implantation for a P-channel device) at a dose of $5 \times 10^{14}$ to $1 \times 10^{16}$ cm$^{-2}$ at 20 to 100 keV. The resulting structure is shown in FIG. 14D.

Figure 14E:
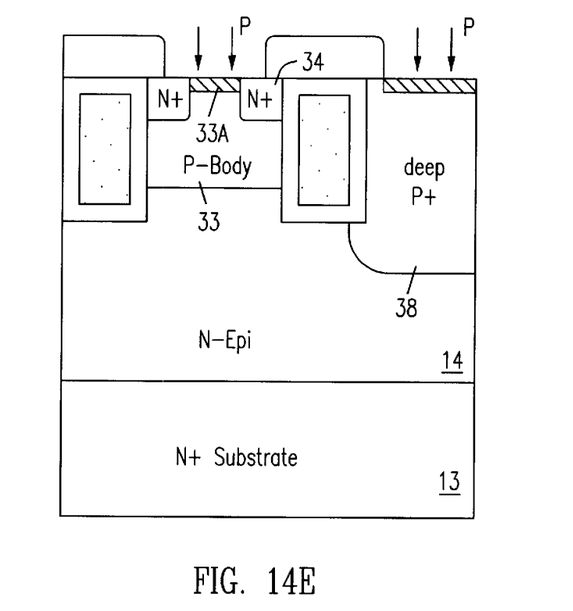

Following the formation of the N+ source region 38, a new mask is formed and the shallow P+ region 33A that is used to contact the P-body is introduced by ion implantation at a dose of $1 \times 10^{13}$ to $5 \times 10^{14}$ cm$^{-2}$ at 20–80 keV. Alternatively, as shown in FIG. 14E, shallow P+ region 33A can be formed by implanting P-type dopant through the same mask that is used in forming the contact holes for the N+ source region/P+ contact region and the deep P+ region. Although with this technique some of the P-type dopant is implanted into N+ source region 34, the level of P-type doping is not sufficient to significantly affect the concentration of N-type ions in the N+ source region.

A thin oxide layer is thermally grown. Borophosphosilicate glass (BPSG) is then deposited on the surface of the structure. The BPSG is momentarily heated to around 850° to 950° C. to flow smoothly and flatten the surface topology of the die. Contact holes are etched in the oxide and BPSG layers, and metal layer 36 is deposited, forming contacts with the source and body regions and the deep P+ region through the contact holes. This yields MOSFET 30 shown in FIG. 3.

The die is then passivated with SiN or BPSG, and pad mask windows are etched to facilitate bonding.

The embodiments described above are illustrative only and not limiting. Numerous alternative embodiments in accordance with the broad principles of this invention will be apparent to those skilled in the art.

I claim:

1. A trench-gated vertical power MOSFET comprising:
   a semiconductor chip, said chip comprising a drain region of a first conductivity type;
   a gate positioned in a trench formed in a surface of said semiconductor chip, said trench defining a two-dimensional array of cells, each of said cells being in the shape of a closed figure and being surrounded on all sides by said trench, each cell in a first group of said cells comprising a MOSFET cell and each cell in a second group of said cells comprising a diode cell, each of said MOSFET cells comprising:
      a source region of said first conductivity type and a body region of a second conductivity type adjoining said source region, said body region comprising a channel region adjacent a side of said trench, said channel region being for conducting a current between said source and drain regions when said power MOSFET is turned on;
   each of said diode cells comprising:
      a protective diffusion of said second conductivity type, said protective diffusion forming a junction with said drain region so as to form a diode, said diode being connected in parallel with said channel region in each of said MOSFET cells, said diode cell containing no channel region adjacent a side of said trench; and
      wherein said diode cells are distributed at repetitive intervals in said two-dimensional array, there being a predetermined number of MOSFET cells for every diode cell in said array, said diode cells being positioned in said array so as to limit the strength of an electric field and the formation of hot carriers in the vicinity of said trench throughout said array.

2. The MOSFET of claim 1 wherein said semiconductor chip comprises a substrate and an epitaxial layer formed on a surface of said substrate, said substrate having a greater doping concentration than said epitaxial layer.

3. The MOSFET of claim 2 wherein a bottom of said trench is located in said epitaxial layer and is separated from an interface between said substrate and said epitaxial layer.

4. The MOSFET of claim 3 wherein a bottom of said protective diffusion is located in said epitaxial layer and is separated from said interface between said substrate and said epitaxial layer.

5. The MOSFET of claim 4 wherein said protective diffusion is shorted to the source region of each of said MOSFET cells.

6. The MOSFET of claim 2 wherein a bottom of said trench is located in said substrate.

7. The MOSFET of claim 6 wherein a bottom of said protective diffusion is located at an interface between said substrate and said epitaxial layer.

8. The MOSFET of claim 6 wherein a region of said first conductivity in said epitaxial layer separates said body region from said substrate in said MOSFET cells.

9. The MOSFET of claim 1 wherein said trench forms a lattice of square cells.

10. The MOSFET of claim 1 wherein said trench forms a lattice of cells in the form of stripes.

11. The MOSFET of claim 6 wherein said gate is separated from said semiconductor chip by a gate oxide layer, and wherein said diode has a breakdown voltage that is lower than a voltage that causes damage to said gate oxide layer.

12. The MOSFET of claim 8 wherein a region of said first conductivity in said epitaxial layer separates said protective diffusion from said substrate in said diode cell.

13. A trench-gated power MOSFET comprising:
a semiconductor chip comprising an epitaxial layer overlying a substrate, said substrate having a greater doping concentration than said epitaxial layer;
a trench formed in said epitaxial layer and extending through said epitaxial layer and into said substrate, a gate being formed in said trench and separated by an oxide layer from said substrate, said trench defining a lattice, said lattice defining a plurality of MOSFET cells, each of said MOSFET cells comprising a source region of a first conductivity type and a body region of a second conductivity type adjoining said source region, said source region and said body region abutting a side of said trench, said body region comprising a channel region for conducting a current when said MOSFET is turned on;
wherein said body region adjoins a drain region of said first conductivity type, a PN junction between said body region and said drain region forming a diode, said diode having a breakdown voltage that is less than or equal to 4 megavolts/centimeter multiplied by a thickness of said oxide layer at a bottom of said trench, said thickness being expressed in centimeters.

14. The MOSFET of claim 13 wherein said body region is shorted to said source region in each of said MOSFET cells.

15. A vertical power semiconductor switch comprising a semiconductor substrate, a first terminal of said switch being located adjacent a top side of said substrate and a second terminal of said switch being located adjacent a back side of said substrate, a trench being formed in a surface of said substrate and containing a gate, said trench being in the form of a lattice and defining a two-dimensional array comprising a plurality of MOSFET cells and a plurality of diode cells, each of said MOSFET and diode cells being in the form of a closed figure and being surrounded on all sides by said trench, each of said MOSFET cells containing a MOSFET, each of said diode cells containing a diode but no MOSFET, said diode cells being positioned at predetermined locations in said two-dimensional array such that said diode cells break down and protect said MOSFET cells from damage arising from a voltage applied between said first and second terminals when said switch is turned off.

16. The power semiconductor switch of claim 15 wherein each of said MOSFETs is connected in parallel with each of said diodes.

17. The power semiconductor switch of claim 16 wherein each of said diodes is connected such that a forward direction of current flow through said diodes is opposite to a normal direction of current flow between said first and second terminals.

18. The MOSFET of claim 13 wherein said source and body regions in each of said MOSFET cells are formed in said epitaxial layer.

19. The power semiconductor switch of claim 15 wherein said diode cells are positioned in a repetitive pattern within said two-dimensional array.

20. The power semiconductor switch of claim 19 wherein there are subgroups of cells within said two-dimensional array, each subgroup containing n cells, m cells in said subgroup comprising diode cells and n–m cells within said subgroup comprising MOSFET cells.

21. A trench gated vertical MOSFET comprising:
a semiconductor chip, said chip comprising a drain region of a first conductivity type;
a gate positioned in a trench formed in a surface of said semiconductor chip, said trench defining an array of MOSFET cells and diode cells, each of said MOSFET cells comprising:
a source region of said first conductivity type; and
a body region of a second conductivity type adjoining said source region, said body region comprising a channel region adjacent a side of said trench, said channel region being for conducting a current between said source and drain regions when said MOSFET is turned on;
said MOSFET cells comprising a first group of cells and a second group of cells, the cells in said second group being larger than the cells in said first group, said body region in said first group being located entirely above a level of a bottom of said trench, the cells in said second group comprising a protective deep body diffusion such that a portion of said body region extends below said level of the bottom of said trench.

22. The MOSFET of claim 13 further comprising a contact region of said second conductivity type abutting said body region and adjacent a surface of said epitaxial layer, said contact region being doped more heavily than said body region, said contact region, said substrate, and a portion of said body region between said contact region and said substrate forming a PIN diode, said PIN diode having a breakdown voltage that is less than or equal to 4 megavolts/centimeter multiplied by a thickness of said oxide layer at a bottom of said trench, said thickness being expressed in centimeters.

23. The MOSFET of claim 6 wherein a PN junction between said body region and said drain region in said MOSFET cells is located above an interface between said epitaxial layer and said substrate.

24. The MOSFET of claim 23 wherein a PN junction between said protective diffusion and said drain region is coincident with said interface between said epitaxial layer and said substrate.

25. The MOSFET of claim 23 wherein a portion of said MOSFET cells between said PN junction and said interface is doped with material of said first conductivity type.

26. The MOSFET of claim 23 wherein a portion of said MOSFET cells between said PN junction and said interface is doped with material of said second conductivity type.

27. The MOSFET of claim 6 wherein a PN junction between said body region and said drain region in said MOSFET cells is coincident with an interface between said epitaxial layer and said substrate.

* * * * *

UNITED STATES PATENT AND TRADEMARK OFFICE
CERTIFICATE OF CORRECTION

PATENT NO. : 5,998,836  
DATED : December 7, 1999  
INVENTOR(S) : Richard K. Williams Page 1 of 1

It is certified that error appears in the above-identified patent and that said Letters Patent is hereby corrected as shown below:

<u>Column 5,</u>  
Line 55, delete "$n/n-1=21/20$" and insert -- $n/(n-1)=21/20$ --.

Signed and Sealed this

Twenty-first Day of May, 2002

Attest:

Attesting Officer

JAMES E. ROGAN  
Director of the United States Patent and Trademark Office